(12) United States Patent
Chen et al.

(10) Patent No.: US 9,979,301 B2
(45) Date of Patent: May 22, 2018

(54) CONTROL METHOD AND CONTROL CIRCUIT FOR SWITCHING POWER SUPPLY

(71) Applicant: Silergy Semiconductor Technology (Hangzhou) LTD, Hangzhou, ZheJiang Province (CN)

(72) Inventors: Huiqiang Chen, Hangzhou (CN); Yunlong Han, Hangzhou (CN); Xiaoru Xu, Hangzhou (CN); Wei Chen, Saratoga, CA (US)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days. days.

(21) Appl. No.: 15/429,508

(22) Filed: Feb. 10, 2017

(65) Prior Publication Data

US 2017/0155330 A1   Jun. 1, 2017

Related U.S. Application Data

(63) Continuation of application No. 14/598,396, filed on Jan. 16, 2015, now Pat. No. 9,641,084.

(30) Foreign Application Priority Data

Jan. 17, 2014 (CN) .......................... 2014 1 0021050

(51) Int. Cl.
*H02M 3/335* (2006.01)
(52) U.S. Cl.
CPC .............................. *H02M 3/33507* (2013.01)
(58) Field of Classification Search
None
See application file for complete search history.

(56) References Cited

U.S. PATENT DOCUMENTS

| 7,432,694 | B2 | 10/2008 | Brenden et al. | |
| 8,289,732 | B2* | 10/2012 | Li | H02M 3/33515 363/21.12 |
| 2009/0040796 | A1* | 2/2009 | Lalithambika | H02M 3/33507 363/21.17 |
| 2013/0313989 | A1 | 12/2013 | Chen | |
| 2014/0103895 | A1 | 4/2014 | Xu et al. | |
| 2014/0145679 | A1 | 5/2014 | Chen | |
| 2014/0160804 | A1* | 6/2014 | Sato | H02M 3/33507 363/21.01 |
| 2014/0167724 | A1 | 6/2014 | Deng et al. | |
| 2014/0210353 | A1 | 7/2014 | Chen | |

FOREIGN PATENT DOCUMENTS

CN          102957304 A        3/2013

* cited by examiner

*Primary Examiner* — Henry Lee, III
(74) *Attorney, Agent, or Firm* — Michael C. Stephens, Jr.

(57) ABSTRACT

In one embodiment, a method of controlling a switching power supply, can include: (i) generating a driving current signal that follows a waveform of a sense voltage signal, where the sense voltage signal is related to a current through a collector of a transistor that is configured as a power switch of the switching power supply, where the collector is coupled to an inductive element of the switching power supply; (ii) providing the driving current signal to a base of the transistor, where the transistor is in a saturated conduction state when a pulse-width modulation (PWM) signal is active; and (iii) releasing charge accumulated on the base when the PWM signal is inactive to turn off the transistor.

14 Claims, 10 Drawing Sheets

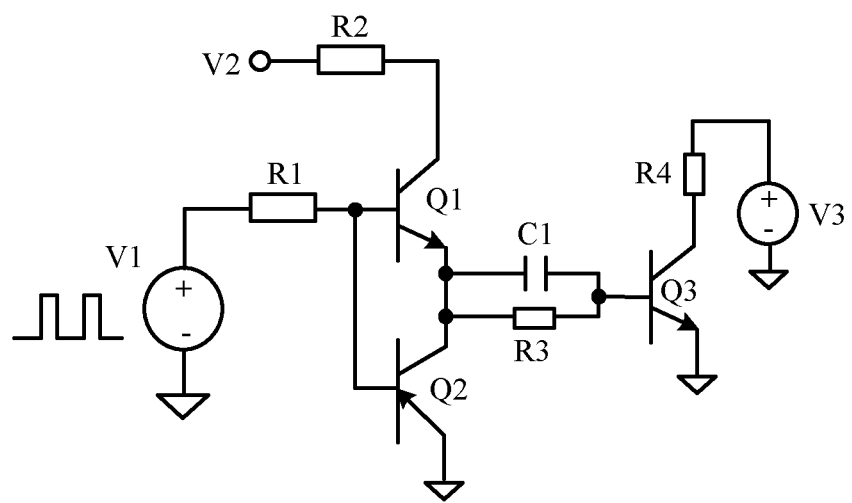
FIG. 1
(conventional)

CONTROL METHOD AND CONTROL CIRCUIT FOR SWITCHING POWER SUPPLY

RELATED APPLICATIONS

This application is a continuation of the following application, U.S. patent application Ser. No. 14/598,396, filed on Jan. 16, 2015, and which is hereby incorporated by reference as if it is set forth in full in this specification, and which also claims the benefit of Chinese Patent Application No. 201410021050.8, filed on Jan. 17, 2014, which is incorporated herein by reference in its entirety.

FIELD OF THE INVENTION

The present invention generally relates to the field of power electronics, and more particularly to a control methods and circuits for a switching power supply.

BACKGROUND

Switch mode power supplies can efficiently convert electrical power from a source to a load, or to several different loads, with each corresponding to a different output. The main transistor of a switching-mode supply can switch between on and off states at a given operating frequency, and voltage regulation can be achieved by varying the ratio of the on-to-off time of the main transistor. Switch mode power supplies may have relatively high power conversion efficiency, as compared to other types of power converters. Switch mode power supplies may also be substantially smaller and lighter than a linear supply due to the smaller transformer size and weight. Switch mode power supplies can be used in many applications, such as LED driver circuits.

SUMMARY

In one embodiment, a method of controlling a switching power supply, can include: (i) generating a driving current signal that follows a waveform of a sense voltage signal, where the sense voltage signal is related to a current through a collector of a transistor that is configured as a power switch of the switching power supply, where the collector is coupled to an inductive element of the switching power supply; (ii) providing the driving current signal to a base of the transistor, where the transistor is in a saturated conduction state when a pulse-width modulation (PWM) signal is active; and (iii) releasing charge accumulated on the base when the PWM signal is inactive to turn off the transistor.

In one embodiment, a control circuit for a switching power supply, can include: (i) a driving signal generator configured to generate a driving current signal that follows a waveform of a sense voltage signal, where the sense voltage signal is related to a current through a collector of a transistor that is configured as a power switch of the switching power supply, where the collector is coupled to an inductive element of the switching power supply; (ii) a first switch circuit coupled between the driving signal generator and a base of the transistor; and (iii) a second switch circuit coupled to the base of the transistor, where the first switch circuit is on, the transistor is in a saturated conduction state, and the second switch circuit is off when a PWM signal is active, and where the first switch circuit is off, the second switch circuit is on, and charge on the base is released through the second switch circuit to turn off the transistor when the PWM signal is inactive.

BRIEF DESCRIPTION OF THE DRAWINGS

FIG. 1 is a schematic block diagram of an example of using a transistor as a power switch.

DETAILED DESCRIPTION

Figure 2:
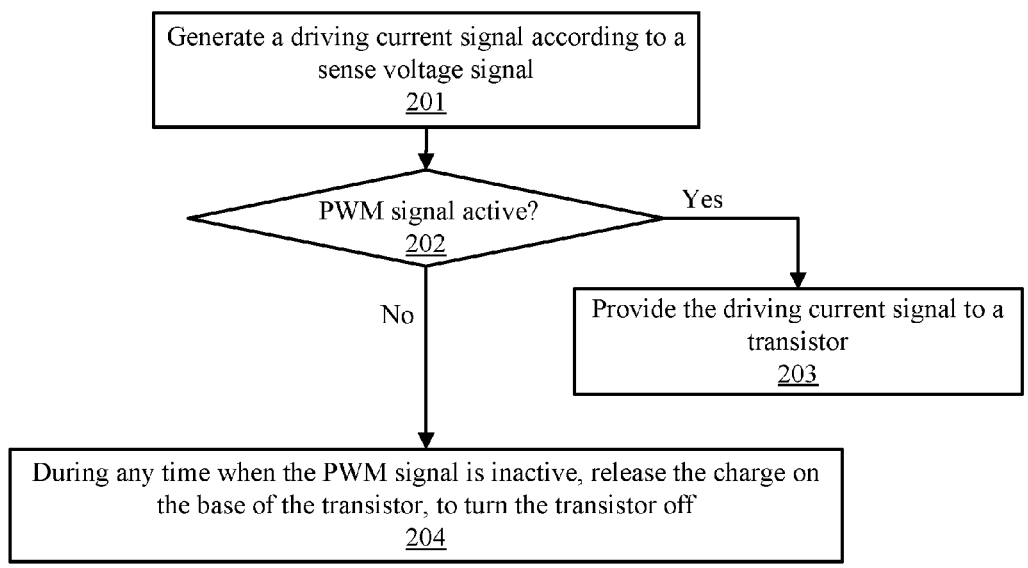
FIG. 2 is a flow diagram of a first example control method for a switching power supply, in accordance with embodiments of the present invention.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

A switching power supply can generate a substantially stable output voltage by controlling a ratio of an on time and off time of a power switch (e.g., a power transistor) with a pulse-width modulation (PWM) control signal. Transistors (e.g., a bipolar-junction transistor [BJT], a MOS transistor, etc.) may be used as power switches in switching power supplies because of relatively low saturation voltage drop characteristics.

Referring now to FIG. 1, shown is a schematic block diagram of an example of using a transistor (e.g., transistor Q3) as a power switch. In this example, when PWM signal V1 is high, switch Q2 may be off, and switch Q1 may be on.

A driving current can flow to the base of transistor Q3, and after transistor Q3 is turned on, a stable loop may be generated by V2-Q1-R3-Q3. Thus, the base current of transistor Q3 may be sufficiently large to maintain transistor Q3 in a saturated conduction state. During this process, a relatively large amount of charge may be accumulated on the base of transistor Q3.

When PWM signal V1 goes low, switch Q1 may be turned off, and switch Q2 can be turned on. The charge accumulated on the base of transistor Q3 may be discharged to a certain value via a discharging loop made up of C1 and Q2. Thus, base-emitter voltage Vbe of transistor Q3 may be less than or equal to a threshold voltage, which can result in "shutdown" or turn off of transistor Q3. On/off of transistor Q3 can be controlled in this fashion. However, because a relatively large amount of charge can accumulate on the base of transistor Q3 when transistor Q3 is on, transistor Q3 can be turned off relatively slowly due to its low discharging speed.

In one embodiment, a method of controlling a switching power supply, can include: (i) generating a driving current signal that follows a waveform of a sense voltage signal, where the sense voltage signal is related to a current through a collector of a transistor that is configured as a power switch of the switching power supply, where the collector is coupled to an inductive element of the switching power supply; (ii) providing the driving current signal to a base of the transistor, where the transistor is in a saturated conduction state when a pulse-width modulation (PWM) signal is active; and (iii) releasing charge accumulated on the base when the PWM signal is inactive to turn off the transistor.

Referring now to FIG. 2, shown is a flow diagram of a first example control method for a switching power supply, in accordance with embodiments of the present invention. At step 201 a driving current signal can be generated according to a sense voltage signal. For example, transistor Q1 (e.g., A BJT transistor) can be used as a power switch in a switching power supply. Also, the collector of transistor Q1 can connect to an inductive element (e.g., inductor L) of the switching power supply, and collector current Ic flowing through transistor Q1 may be equal to inductor current IL of the switching power supply (see, e.g., FIG. 10).

Figure 6:
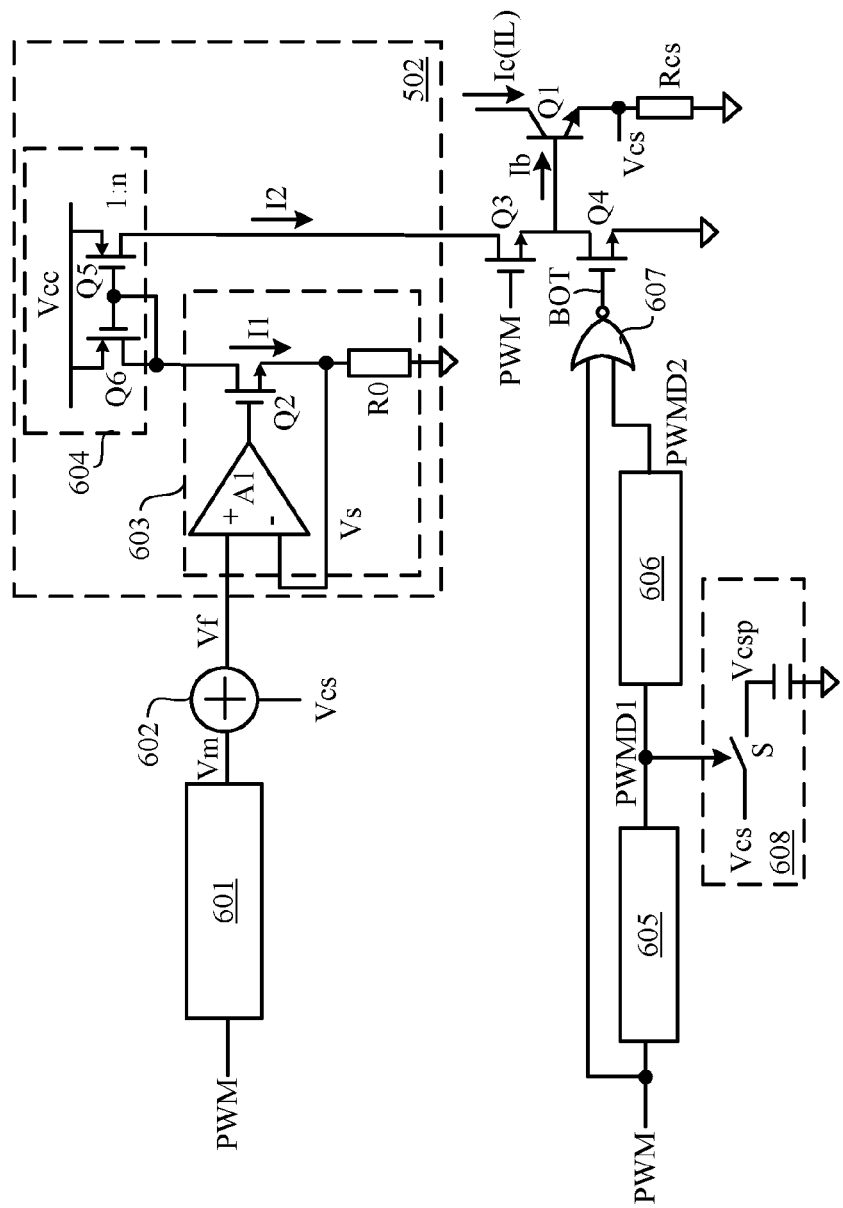
FIG. 6 is a schematic block diagram of a second example control circuit for a switching power supply, in accordance with embodiments of the present invention.
Figure 7:
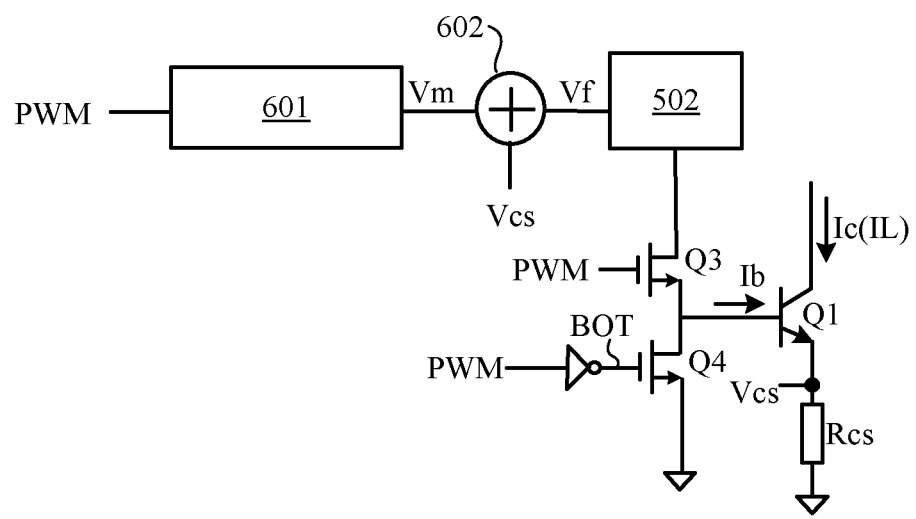
FIG. 7 is a schematic block diagram of a third example control circuit for a switching power supply, in accordance with embodiments of the present invention.
Figure 8:
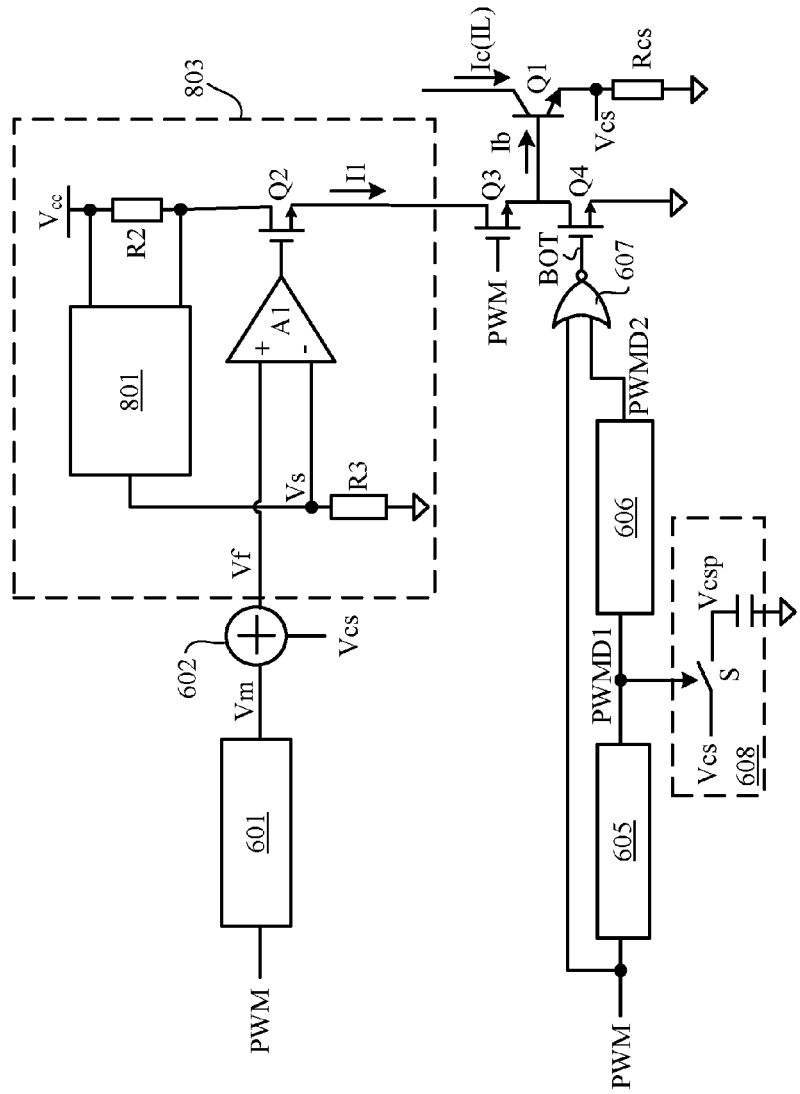
FIG. 8 is a schematic block diagram of a fourth example control circuit for a switching power supply, in accordance with embodiments of the present invention.

For example, the emitter voltage of transistor Q1 can be configured as sense voltage signal Vcs (see, e.g., FIGS. 6-8). Sense voltage signal Vcs can include information about collector current Ic of transistor Q1. In this example, the waveform of driving current signal Ib that is generated according to sense voltage signal Vcs can follow that of (e.g., have substantially the same waveform shape and/or relative voltage values as) sense voltage signal Vcs (see, e.g., FIG. 9).

At 202, it can be determined if a PWM signal is active (e.g., high). When the PWM signal is active, the flow can proceed to 203, and may otherwise proceed to 204. While signals as described herein may generally be active high and inactive low, those skilled in the art will recognize that a signal can alternatively be determined as active when it is at a low level, and as inactive when at a high level. At step 203, a driving current signal can be provided to the base of transistor Q1. Driving current signal Ib at the base of transistor Q1 can be used to turn on transistor Q1, and to hold the transistor in a saturated conduction state until the PWM signal goes inactive. At 204, during any time when the PWM signal is inactive, the charge on the base of transistor Q1 can be released (e.g., through a discharging circuit), and the transistor can be turned off.

The time period during which the PWM signal is inactive may be indicated as time period T2. In this particular example, a switching circuit coupled to transistor Q1 can be on during a time period T3, in order to release the charge accumulated on the base of transistor Q1 to a certain value via a discharging circuit. Thus, the base-emitter voltage of transistor Q1 (Vbe) may be less than or equal to a threshold voltage, in order to turn transistor Q1 off. For example, time period T3 can be equal to time period T2, or be a portion of time period T2.

Figure 9:
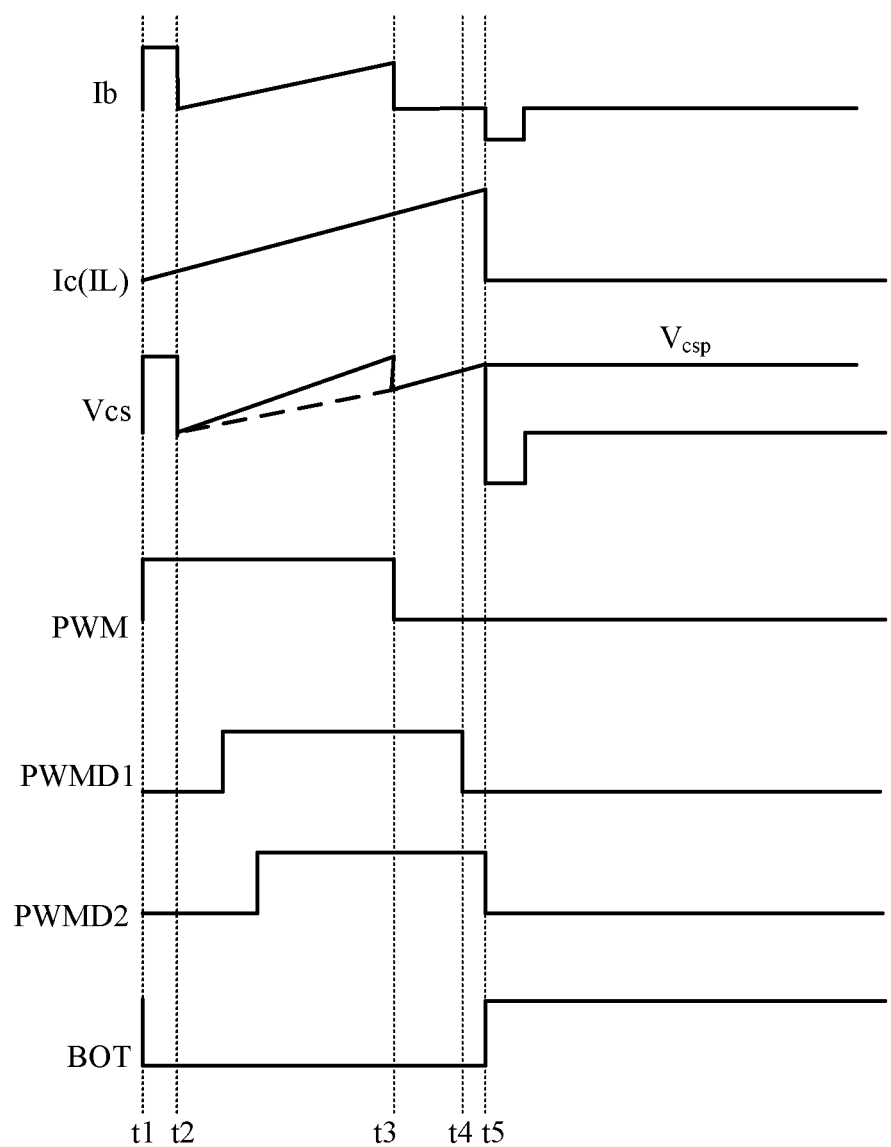
FIG. 9 is a waveform diagram showing example operation of a control circuit, in accordance with embodiments of the present invention.

As shown in FIG. 9, the switching circuit coupled to the base of transistor Q1 can be turned on at the moment when the PWM signal goes inactive, or at any moment when the PWM signal is inactive. In this way, the charge on the base of transistor Q1 can be released. Also, because driving current signal Ib for turning on transistor Q1 follows collector current Ic of transistor Q1, too much charge accumulated on the base of transistor Q1 due to unnecessary current can be substantially avoided. Thus, the discharging speed can be reduced to shorten the turn off time. In this fashion, the switching response speed of transistor Q1 can be improved in certain embodiments.

Figure 3:
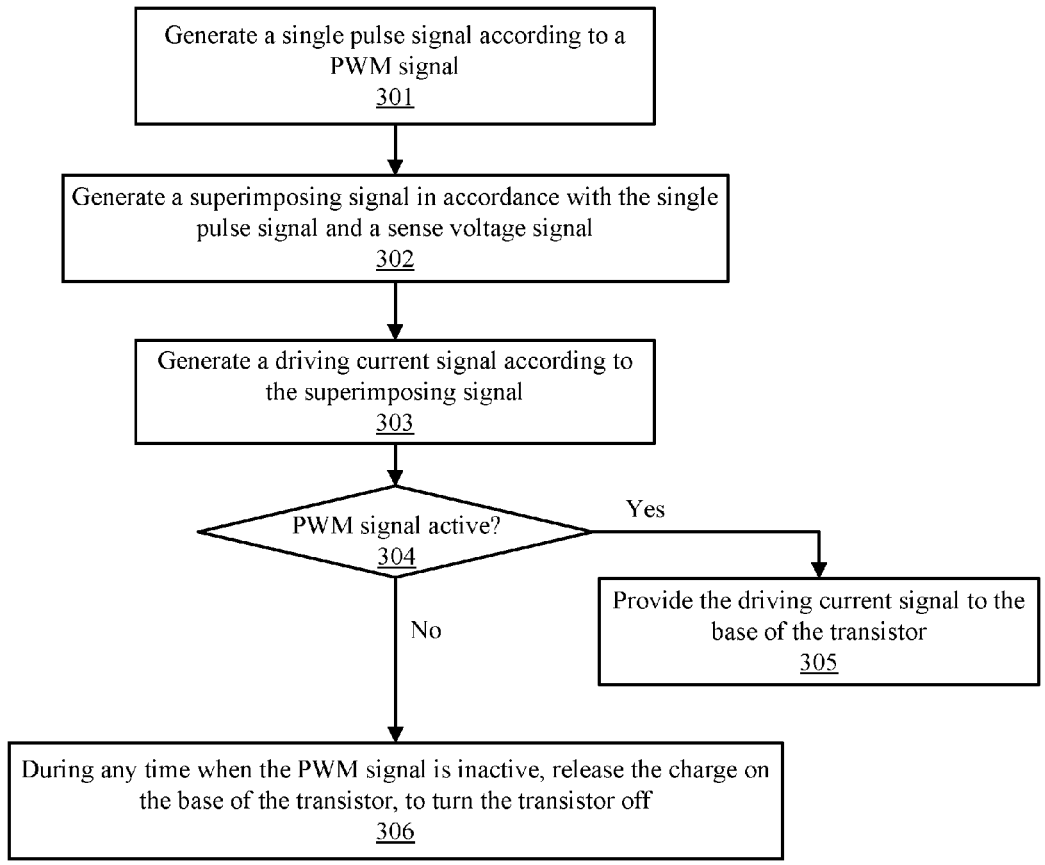
FIG. 3 is a flow diagram of a second example control method for a switching power supply, in accordance with embodiments of the present invention.

Referring now to FIG. 3, shown is a flow diagram of a second example control method for a switching power supply, in accordance with embodiments of the present invention. At 301, a single pulse signal can be generated according to the PWM signal. As an example, single pulse signal Vm can be generated at a falling edge (e.g., high to low transition) of the PWM signal, where single pulse signal Vm has the same period as the PWM signal. As examples, with reference to FIGS. 6-8, the PWM signal can be provided to single pulse generator 601 in order to generate single pulse signal Vm at a falling edge of the PWM signal.

At 302, a superimposing signal can be generated in accordance with the single pulse signal and a sense voltage signal. As examples, with reference to FIGS. 6-8, superimposing circuit 602 can include an adder circuit that receives signal pulse signal Vm and sense voltage signal Vcs at its input terminals, and may generate superimposing signal Vf. In this example, because superimposing signal Vf can include information of single pulse signal Vm and sense voltage signal Vcs, superimposing signal Vf may be a pulse with a large amplitude at the rising edge of the PWM signal. Further, the waveform of superimposing signal Vf may substantially follow that of sense voltage signal Vcs.

At 303, a driving current signal can be generated according to the superimposing signal. Here, the waveform of driving current signal Ib can substantially follow that of superimposing signal Vf. For example, driving current signal Ib may have a relatively large amplitude at an initial stage to turn on transistor Q1, and then may follow the waveform of sense voltage signal Vcs in order to avoid too much charge being accumulated on the base of transistor Q1 (see, e.g., FIG. 9). For example, operational amplifier 603 (see, e.g., FIG. 6) can utilized in generating the driving signal.

At step 304, it can be determined if the PWM signal is active. When a PWM signal is active, the flow can proceed to 305, and otherwise may proceed to 306. At 305, the driving current signal can be provided to the base of the transistor. Because the waveform of driving current signal Ib may that of superimposing signal Vf, driving current signal Ib may have a relatively large amplitude at a rising edge of the PWM signal, and may substantially the waveform of sense voltage signal Vcs. As shown in FIG. 9, when the PWM signal is active, driving current signal Ib can provided to the base of transistor Q1. Because driving current signal Ib may have a relatively large amplitude at a rising edge (e.g., at time t1) of the PWM signal, transistor Q1 can be instantly turned on, and may remain in a stable saturated conduction state until the PWM signal goes inactive.

At 306, during any time when the PWM signal is inactive, the charge on the base of the transistor can be released in order to turn transistor Q1 off. Also, because driving current signal Ib in this particular example has a relatively large amplitude at the rising edge of the PWM signal, transistor Q1 can be quickly saturated, further improving the turning on speed of transistor Q1.

Figure 4:
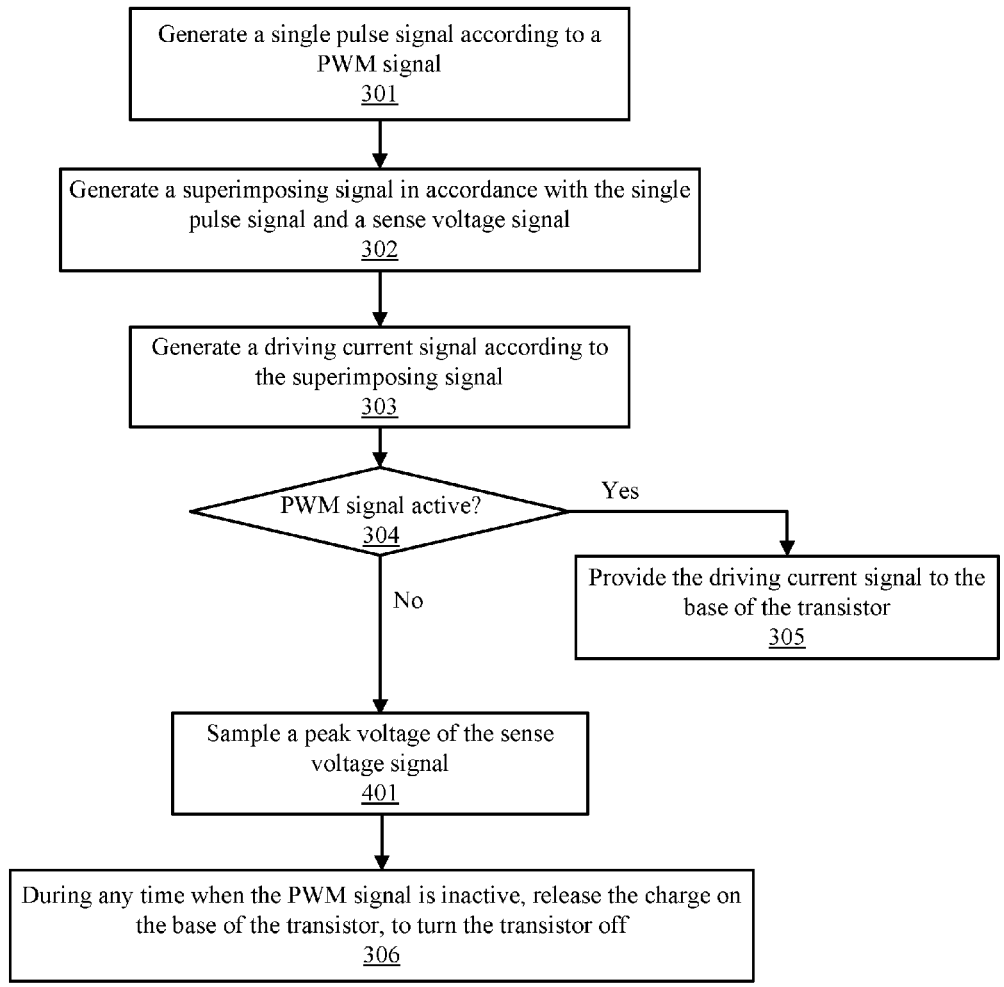
FIG. 4 is a flow diagram of a third example control method for a switching power supply, in accordance with embodiments of the present invention.

Referring now to FIG. 4, shown is a flow diagram of a third example control method for a switching power supply, in accordance with embodiments of the present invention. In this example, prior to 306, at 401, the peak voltage of the sense voltage signal can be sampled. Also, when the PWM signal is active, emitter current Ie of transistor Q1 can be the sum of driving current signal Ib and collector current Ic. Thus, voltage sense signal Vcs obtained at the emitter of transistor Q1 can include information of collector current Ic and driving current signal Ib. As a result, information of inductor current IL of the switching power supply may not be precisely obtained.

When the PWM signal is inactive, driving current signal Ib of transistor Q1 can be zero, and collector current Ie of transistor Q1 may equal collector current Ic. In this case, voltage sense signal Vcs obtained at the emitter of transistor Q1 may include information of collector current Ic. In this way, voltage sense signal Vcs can be used to characterize inductor current IL of the switching power supply.

In this example, when the PWM signal is inactive, peak voltage Vcsp of sense voltage signal Vcs can be obtained to characterize collector current Ic. The peak of inductor current IL of the switching power supply (peak voltage Vcsp) can be is provided to the control circuit of the switching power supply for precisely regulating an output current or an output voltage thereof. Proceeding to 306 after 401, the charge on the base of transistor Q1 can be released in order to turn off transistor Q1. As an example, 306 can be executed after a predetermined time (e.g., a "dead" time) when the peak voltage sampling process is completed, in order to guarantee the accuracy of the sampling of the peak voltage.

In one example, a control circuit for a switching power supply, can include: (i) a driving signal generator configured to generate a driving current signal that follows a waveform of a sense voltage signal, where the sense voltage signal is related to a current through a collector of a transistor that is configured as a power switch of the switching power supply, where the collector is coupled to an inductive element of the switching power supply; (ii) a first switch circuit coupled between the driving signal generator and a base of the transistor; and (iii) a second switch circuit coupled to the base of the transistor, where the first switch circuit is on, the transistor is in a saturated conduction state, and the second switch circuit is off when a PWM signal is active, and where the first switch circuit is off, the second switch circuit is on, and charge on the base is released through the second switch circuit to turn off the transistor when the PWM signal is inactive.

Figure 5:
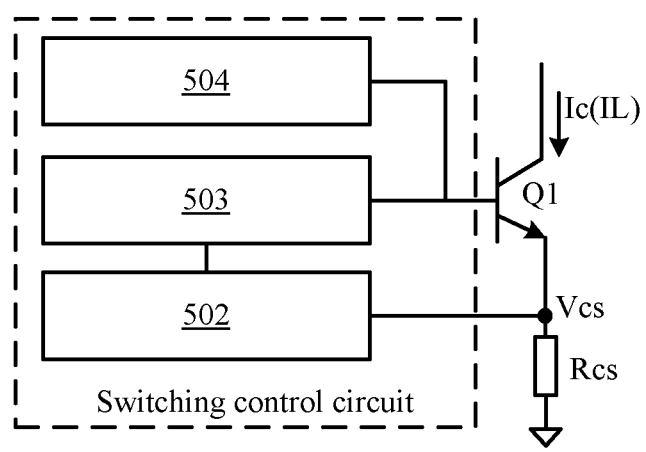
FIG. 5 is a schematic block diagram of a first example control circuit for a switching power supply, in accordance with embodiments of the present invention.

Referring now to FIG. 5, shown is a schematic block diagram of a first example control circuit for a switching power supply, in accordance with embodiments of the present invention. This circuit example can include driving signal generator 502, switch circuit 503, and switch circuit 504. For example, driving signal generator 502 can receive sense voltage signal Vcs, and may generate driving signal Ib with a waveform following that of sense voltage signal Vcs. Sampling resistor Rcs can connect to the emitter of transistor Q1, in order to obtain sense voltage signal Vcs for driving signal generator 502.

Switch circuit 503 can connect between driving signal generator 502 and the base of transistor Q1, and the control terminal can receive the PWM signal. Switch circuit 504 can connect between the base of transistor Q1 and ground. When the PWM signal is active, switch circuit 504 may be off, and switch circuit 503 can be on. At this time, driving current signal Ib may be provided to the base of transistor Q1 through switch circuit 503, and transistor Q1 can be turned on and maintained in a saturated conduction state. At any time when the PWM signal is inactive, switch circuit 503 may be off, and switch circuit 504 can be on. At this time, the charge on the base of transistor Q1 may be discharged through a discharging circuit including switch circuit 504. Also, transistor Q1 may be off when the base-emitter voltage (Vbe) is less than or equal to the threshold voltage.

Referring now to FIGS. 6, 7, and 8, shown are schematic block diagrams of example control circuits for a switching power supply, in accordance with embodiments of the present invention. In these examples, transistor Q3 can be switch circuit 503, and transistor Q4 can be switch circuit 504. With reference to FIG. 7, transistor Q4 can be turned on at a falling edge of the PWM signal. In this case, the base of transistor Q1 can be coupled to ground through transistor Q4, and the charge on the base of transistor Q1 can be released/discharged. As other examples, with reference to FIGS. 6-8, transistor Q4 can be controlled by control signal BOT which lags the PWM signal, and can be turned on at a certain time (e.g., time t5 in FIG. 9) after the falling edge of the PWM signal. In this case, the base of transistor Q1 can be coupled to ground through transistor Q4, and the charge on the base of transistor Q1 can be released.

For example, the control circuit can include single pulse generator 601 and superimposing circuit 602. Single pulse generator 601 may have an input terminal for receiving the PWM signal, and may generate signal pulse signal Vm at a rising edge of the PWM signal. Thus, single pulse signal Vm may have a relative large amplitude at the rising edge. Superimposing circuit 602 may have input terminals coupled to single pulse generator 601 and the emitter of transistor Q1, and an output terminal coupled to an input terminal of driving signal generator 502.

Superimposing circuit 602 can add single pulse signal Vm and sense voltage signal Vcs to obtain superimposing signal Vf with a relatively large amplitude at the rising edge of the PWM signal. Also, superimposing signal Vf can follow the waveform of sense voltage signal Vcs. Therefore, driving signal generator 502 can generate driving signal Ib with a waveform following that of superimposing signal Vf. In this example, as driving current signal Ib may have a relatively large amplitude at the rising edge of the PWM signal, transistor Q1 can be quickly saturated such that the turning on speed of transistor Q1 is further improved.

As an example, with reference to FIG. 6, driving signal generator 502 can include operational amplifying circuit 603 and current mirror circuit 604. Operational amplifying circuit 603 can include operational amplifier A1 and transistor Q2. The gate of transistor Q2 can connect to an output terminal of operational amplifier A1, and the drain can connect to an input terminal of current mirror circuit 604. Sampling resistor R0 can be coupled between the source of transistor Q2 and ground, in order to obtain feedback voltage signal Vs, where Vs=R0*I1. The source of transistor Q2 can connect to the inverting input terminal of operational amplifier A1, and feedback voltage signal Vs can be provided to the second input terminal. Superimposing signal Vf can be provided to the non-inverting input terminal of operational amplifier A1. Current signal I1 can be generated at the output terminal of operational amplifier 603, and may have a waveform following superimposing signal Vf.

Current mirror circuit 604 can output current signal I2 in a certain proportion to current signal I1 by mirroring current signal I1, where I2=n×I1, and n is a ration of areas between transistors Q5 and Q6 in current mirror circuit 604. Current signal I2 can be provided to switch circuit 503. When switch circuit 503 is turned on, current signal I2 can be configured as driving current signal Ib to be provided to the base of transistor Q1. In this way, driving current signal Ib can be easily regulated by adjusting current mirror circuit 604.

As another example, with reference to FIG. 8, the driving signal generator can be implemented by operational amplifying circuit 803. Operational amplifying circuit 803 can include operational amplifier A1, transistor Q2, and a voltage feedback circuit including voltage-current conversion circuit 801 and sampling resistors R2 and R3. The source of transistor Q2 can connect to transistor Q3, and driving current signal Ib can be provided to transistor Q3. The gate of transistor Q2 can connect to an output terminal of operational amplifier A1, and the drain can connect to sampling resistor R2. Voltage-current conversion circuit 801 can connect to two terminals of sampling resistor R2, which may be configured to convert the voltage across sampling resistor R2 to a current signal. The current signal flowing through sampling resistor R3 can be used to obtain feedback voltage signal Vs, where Vs=I1×R2×R3×k. Therefore, I1=Vs/(R2×R3×k), where k is a coefficient of voltage-current conversion circuit 801.

Feedback voltage signal Vs can be provided to the inverting input terminal of operational amplifier A1, and superimposing signal Vf is provided to the non-inverting input terminal of operational amplifier A1. In this way, feedback voltage signal Vs is a waveform that follows that of superimposing signal Vf in accordance with the "virtual short circuit" principle of an operational amplifier, in order to realize that current I1 following superimposing signal Vf. Also, current signal I1 can be configured as driving signal Ib of transistor Q1.

As examples, with reference to FIGS. 7-9, the control circuit can include delay circuit 605, delay circuit 606, NOR gate 607, and peak value sampling circuit 608. For example, delay circuit 605 can process the PWM signal to generate delay signal PWMD1. Delay circuit 606 can connect to delay circuit 605 for processing delay signal PWMD1 to generate delay signal PWMD2. Peak value sampling circuit 608 can connect to delay circuit 605 and to the emitter of transistor Q1. When delay signal PWMD1 goes inactive (e.g., at time t4 in FIG. 9), peak value sampling circuit 608 can operate normally to obtain peak voltage Vcsp of sense voltage signal Vcs for the control circuit of the switching power supply, as discussed above with reference to 401 in FIG. 4.

NOR gate 607 can receive the PWM signal and delay signal PWMD2 at its input terminals, and can connect to a control terminal of switching circuit 504 for providing switch control signal BOT. In this example, when control signal BOT signal is active (e.g., at time t5 in FIG. 9), switch circuit 504 can be turned on, and the charge on the base of transistor Q1 may be released through the discharging circuit including switch circuit 504.

Referring now to FIG. 9, shown is a waveform diagram of example operation of a control circuit, in accordance with embodiments of the present invention. Specifically, waveforms of the PWM signal, and delay signals PWMD1 and PWMD2 are shown in this example. Here, the rising edge of signal PWM can be configured as a first transition of driving current signal Ib. From time t1 to time t2, as driving current signal Ib is provided to the base of transistor Q1 and may relatively large amplitude, transistor Q1 can be quickly saturated. From time t2 to time t3, driving current signal Ib can become greater along with sense voltage signal Vcs.

At time t3, the PWM signal may go inactive, switch circuit 503 can be turned off, and the base current of transistor Q1 may be reduced to zero. In this case, the emitter current of transistor Q1 may be equal to the collector current. Therefore, sense voltage signal Vcs obtained at the emitter may contains information of collector current Ic. At time t4, delay signal PWMD1 can go inactive. In order to use sense voltage signal Vcs to represent collector current Ic and precisely sense peak value of collector current Ic at time t4, the delay for generating delay signal PWMD1 can be suitably set.

At time t5, delay signal PWMD2 may go inactive, and switch control signal BOT can accordingly go active. Under the driving of signal BOT, switch circuit 504 can be turned on, the charge on the base of transistor Q1 may be released/discharged, and transistor Q1 can be turned off. For example, the time from t4 to t5 may be equal to or slightly larger than the dead time of peak sampling circuit 608. This can ensure that switch circuit 504 is turned on after completing peak sampling, in order to release the charge on the base of transistor Q1, and to further guarantee peak sampling accuracy.

Figure 10:
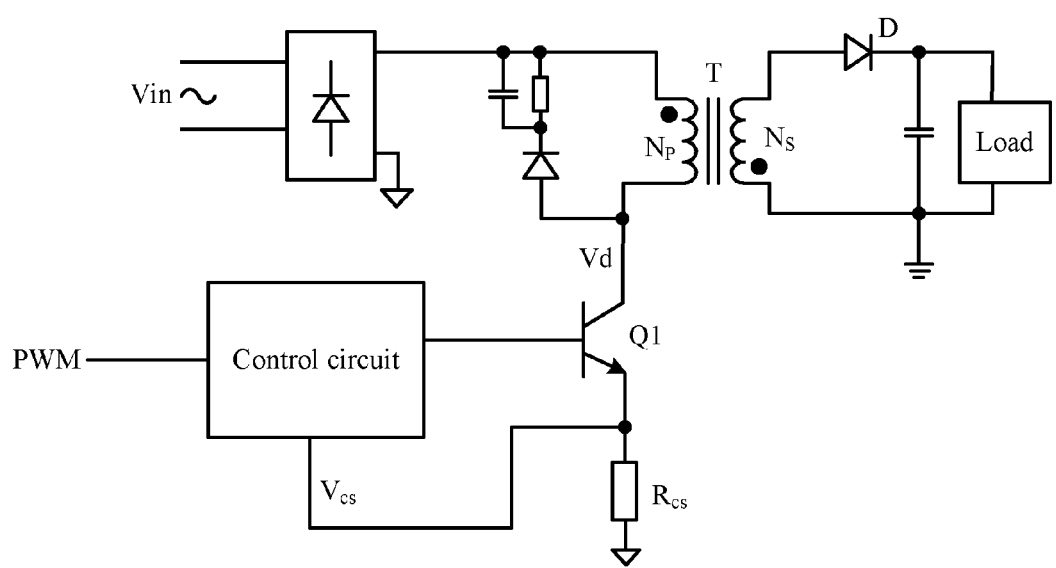
FIG. 10 is a schematic diagram of a switching power supply applying a control circuit, in accordance with embodiments of the present invention.

Referring now to FIG. 10, shown is a schematic diagram of a switching power supply applying a control circuit, in accordance with embodiments of the present invention. The control circuits as discussed above can be employed as the controls circuit for driving the base of transistor Q1 in this particular example. Also, any suitable arrangement or topology (e.g., flyback, boost, buck, etc.) of the switching power supply can be employed in particular embodiments.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A method of controlling a switching power supply, the method comprising:
    a) generating a driving current signal that follows a waveform in accordance with a sense voltage signal at a collector of a transistor to decrease charge accumulation at a base of said transistor;
    b) providing said driving current signal to said base, wherein said transistor is in a saturated conduction state when a pulse-width modulation (PWM) signal is active;
    c) releasing charge accumulated on said base within a time duration when said PWM signal is inactive to turn off said transistor; and
    d) generating, prior to said generating said driving current signal, a single pulse signal at a transition of said PWM signal, a superimposing voltage signal by adding said single pulse signal to said sense voltage signal, and said driving current signal according to said superimposing voltage signal.

2. The method of claim 1, wherein said generating said driving current signal comprises:

a) generating, by a voltage-to-current conversion circuit, a first current signal according to said superimposing voltage signal, wherein a waveform of said first current signal follows a waveform of said superimposing voltage signal; and b) generating said driving current signal according to said first current signal.

3. The method of claim 2, wherein said generating said driving current signal according to said first current signal comprises:

a) receiving said first current signal in a current mirror circuit, and b) generating said driving current signal by said current mirror circuit.

4. The method of claim 1, wherein said sense voltage signal is related to a current through said collector, wherein said transistor that is configured as a power switch of said switching power supply, and wherein said collector is coupled to an inductive element of said switching power supply.

5. A control circuit for a switching power supply, the control circuit comprising:

a) a driving signal generator configured to generate a driving current signal in accordance with a sense voltage signal at a collector of a transistor to decrease charge accumulation at a base of said transistor;

b) a first switch circuit coupled between said driving signal generator and said base;

c) a second switch circuit coupled to said base of said transistor, wherein said first switch circuit is on, said transistor is in a saturated conduction state, and said second switch circuit is off when a pulse-width modulation (PWM) signal is active, and wherein said first switch circuit is off, said second switch circuit is on, and charge on said base is released through said second switch circuit to turn off said transistor within a time duration when said PWM signal is inactive;

d) a single pulse generator configured edge of said PWM signal;

e) a superimposing circuit configured to receive said single pulse generator and a voltage sense circuit, and to generate a superimposing voltage signal; and f) said driving signal generator being configured to generate said driving current signal according to said superimposing voltage signal, wherein said driving signal generator comprises a voltage-to-current conversion circuit configured to generate a first current signal according to said superimposing voltage signal.

6. The control circuit of claim 5, wherein said driving signal generator comprises an operational amplifying circuit configured to receive said superimposing voltage signal, a feedback voltage signal that is proportional to an output current of said operational amplifying circuit, and having an output terminal coupled to said first switch circuit.

7. The control circuit of claim 6, wherein said driving signal generator comprising a current mirror circuit coupled to said operational amplifying circuit and said first switch circuit.

8. The control circuit of claim 5, further comprising:

a) a first delay circuit configured to generate a first delay signal from said PWM signal;

b) a peak sampling circuit configured to generate a peak voltage of said sense voltage signal when said first delay signal is active;

c) a second delay circuit configured to generate a second delay signal from said first delay signal; and d) a NOR gate configured to receive said PWM signal and said second delay signal, and being configured to control said second switch circuit.

9. A switching power supply, comprising the control circuit of claim 5, the switching power supply further comprising:

a) a rectifier coupled to an input supply; and b) a transformer having a primary side coupled to said collector.

10. The method of claim 4, wherein prior to said releasing said charge accumulated on said base of said transistor, further comprising sampling a peak voltage of said sense voltage signal.

11. A control circuit for a switching power supply, the control circuit comprising:

a) a driving signal generator configured to generate a driving current signal in accordance with a sense voltage signal at a collector of a transistor to decrease charge accumulation at a base of said transistor;

b) a first switch circuit coupled between said driving signal generator and said base;

c) a second switch circuit coupled to said base of said transistor, wherein said first switch circuit is on, said transistor is in a saturated conduction state, and said second switch circuit is off when a pulse-width modulation (PWM) signal is active, and wherein said first switch circuit is off, said second switch circuit is on, and charge on said base is released through said second switch circuit to turn off said transistor within a time duration when said PWM signal is inactive;

d) a first delay circuit configured to generate a first delay signal from said PWM signal;

e) a peak sampling circuit configured to generate a peak voltage of said sense voltage signal when said first delay signal is active;

f) a second delay circuit configured to generate a second delay signal from said first delay signal; and g) a NOR gate configured to receive said PWM signal and said second delay signal, and being configured to control said second switch circuit.

12. The control circuit of claim 11, wherein said driving signal generator comprises a feedback voltage signal that is proportional to an output current of an operational amplifying circuit, and having an output terminal coupled to said first switch circuit.

13. The control circuit of claim 11, wherein said driving signal generator comprising a current mirror circuit coupled to said operational amplifying circuit and said first switch circuit.

14. A switching power supply, comprising the control circuit of claim 11, the switching power supply further comprising:

a) a rectifier coupled to an input supply; and b) a transformer having a primary side coupled to said collector.

* * * * *